United States Patent [19]

Moser et al.

[11] Patent Number: 5,184,470

[45] Date of Patent: Feb. 9, 1993

[54] ENDOTHERMIC COOLER FOR ELECTRONIC COMPONENTS

[75] Inventors: Thomas P. Moser, Redondo Beach; Robin W. Rosser, Los Angeles, both of Calif.

[73] Assignee: Hughes Aircraft Company, Los Angeles, Calif.

[21] Appl. No.: 793,887

[22] Filed: Nov. 18, 1991

[51] Int. Cl.[5] .................................................. F25D 5/00
[52] U.S. Cl. ........................................... 62/4; 62/259.2
[58] Field of Search ................................... 62/4, 259.2

[56] References Cited

U.S. PATENT DOCUMENTS

| | | | |
|---|---|---|---|
| 2,893,213 | 7/1959 | Soloway | 62/4 |
| 3,067,594 | 12/1962 | Bland et al. | 62/4 |
| 3,267,856 | 8/1966 | Lindberg. Jr. | 62/4 |
| 3,267,857 | 8/1966 | Lindberg. Jr. | 62/4 |
| 4,462,224 | 7/1984 | Dunshee | 62/4 |
| 4,619,678 | 10/1986 | Rubin | 62/4 |

Primary Examiner—Ronald C. Capossela
Attorney, Agent, or Firm—C. D. Brown; R. M. Heald; W. K. Denson-Low

[57] ABSTRACT

An endothermic cooler (10) for electronic components (16) in, for example, a missile (12) includes an enclosure (14) having a thermally conductive coupling to the electronic component. A source of water in a first compartment (28) is segregated from salts in a second compartment (30). The salts are capable of providing an endothermic reaction when mixed in a water solution. The two compartments are segregated from one another by a membrane or conduit (32). The membrane is pierced by a spike (34-2 or 34-3) through an actuating mechanism (36) and the conduit is opened by a valve (34-4). Formation of the solution provides cooling for conduction of heat from the electronic component through a thermally conductive plate (24) and its fins (26).

3 Claims, 2 Drawing Sheets

ENDOTHERMIC COOLER FOR ELECTRONIC COMPONENTS

BACKGROUND OF THE INVENTION

1. Field of the Invention

The present invention relates to apparati and methods for cooling of electronic components and, more particularly, for endothermic cooling utilizing a composition of matter, such as a salt, which is capable of providing an endothermic reaction when placed in solution.

2. Description of Related Art and Other Considerations

In any electronic equipment, the temperature of each component will rise until it is hot enough to transfer its internally generated heat to the surroundings. If the cooling design is not adequate, the component itself will become overly hot, as it attempts to transfer heat from itself, and will malfunction or even destroy itself. Therefore, many implementations have been designed to conduct heat from the electronic equipment or individual component to the surrounding environment, sometimes aided by cooling fins, by such methods as radiation and natural convection, forced air cooling, forced liquid cooling, and liquid evaporation.

In some cases, the electronic component itself is at a higher temperature than the surroundings. Because heat flows from hot to cold bodies, such components can be cooled by one of above-mentioned methods. In other cases, however, electronic performance can only be achieved by lowering the temperature of the electronic component below that of its surroundings, such as by refrigeration. In the refrigeration process, heat does not flow from the electronic component, but is pumped or otherwise removed by the refrigeration system from the cold component to the hot surroundings. Examples of refrigeration systems for electronic equipment include refrigerated cooling air or cooling liquid, refrigerated heat sinks, and thermoelectric coolers. Each of these refrigeration schemes requires input energy for operation and eventual heat dissipation to the environment.

There are disadvantages associated with conventional cooling arrangements. Their use adds weight and expense to the system in which they are used. For airborne and space vehicles, and to a lesser extent other transportable mechanisms, weight is a very important concern, especially where the overall weight must be apportioned between the payload and the supporting system therefor, whether defined in terms of its propulsion system or otherwise. It is obvious, therefore, that, if the weight of the cooling system can be reduced, the payload can be proportionately increased. This consideration applies not only to the vehicle itself, but also to the transporter for the vehicle. For example, a missile carries a payload or warhead to a target. If the refrigeration system of the missile can be reduced in weight, its warhead or guidance system can be increased. Therefore, for a given weight of missile, it becomes possible to maximize its use. On the other hand, it also becomes possible to decrease the entire weight of the missile and, therefore, to enable the aircraft to add additional equipment or other missiles. These weight considerations become particularly important with respect to mechanisms which do not require greater than a single use, such as is particularly true with respect to missiles.

It is equally obvious that a decrease in weight not only makes the vehicle more cost efficient but also enables the additional costs of special cooling equipment to be reduced, at times to significant degrees.

Therefore, in many cases, expensive and reusable refrigeration methods and mechanisms are not needed, and it becomes advantageous if such needs and attendant hardware, such as external cooling fins, can be eliminated.

SUMMARY OF THE INVENTION

These and other problems are successfully addressed and overcome by the present invention. Briefly, an endothermic cooler is used to refrigerate or cool electronic components and other devices. Specifically, the cooling is attained through the endothermic mixing of certain compositions of matter, such as salts, in a solvent which produces relatively cold solutions. The cold solution provides the necessary temperature reduction required for heat transfer and, therefore, the driving force for cooling the electronic device.

In practice, the salt, or solute, and the water, or solvent, are separately packaged. The preferred packaging is an enclosure having a good thermal contact with the equipment to be cooled. The enclosure is divided into two compartments in which the salt and the water are respectively placed. The compartments are separated by a water-tight membrane to ensure that the salt and the water do not mix until desired, which occurs upon piercing the membrane. Piercing can be initiated upon receipt of a signal from a thermocouple or other heat sensor placed on the component.

An arming mechanism is placed in parallel with the thermocouple so that both the thermocouple and the arming mechanism act together to permit the piercing. This feature is useful during storage of the vehicle in which the electronic component is housed.

Several advantages are derived from this arrangement. Because cooling by use of an endothermic solution requires neither an input energy for operation nor a heat sink for dissipating heat, the costs and weight are significantly reduced over that of conventional cooling systems and methods. Thus, the prior art need for external cooling fins and the need for dissipating waste heat is eliminated. A greater proportion of weight and cost can be directed toward payload, whether for an explosive device in a missile or for guidance systems for directing the vehicle to its intended objective or for other non-cooling purposes. Also, because the heat is not dissipated to the environment, the heat is less likely to be detected by hostile sensors, a potentially significant tactical advantage. The invention becomes particularly useful for systems which are not reusable or intended to be reused, such as in a missile.

Other aims and advantages, as well as a more complete understanding of the present invention, will appear from the following explanation of exemplary embodiments and the accompanying drawings thereof.

DETAILED DESCRIPTION OF THE PREFERRED EMBODIMENTS

Figure 1:
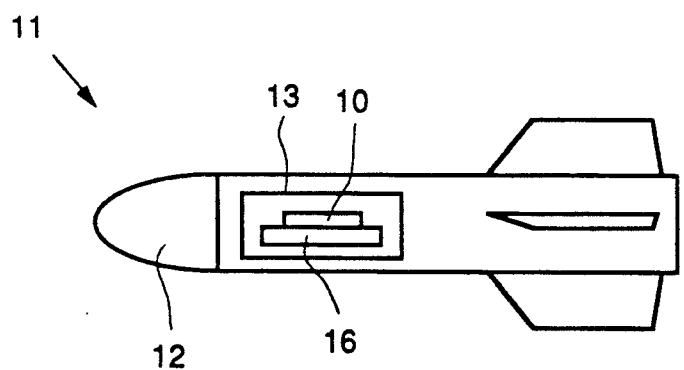
FIG. 1 shows a preferred use of the present invention in a missile guidance system.

As shown in FIG. 1, an endothermic cooler 10 is positioned in a missile 12 for cooling an electronic circuit package or detector package assembly, such as in a missile guidance system 13. Such a cooler 10 is more specifically disclosed as coolers 10-2, 10-3, and 10-4, respectively illustrated in FIGS. 2–4.

Figure 2:
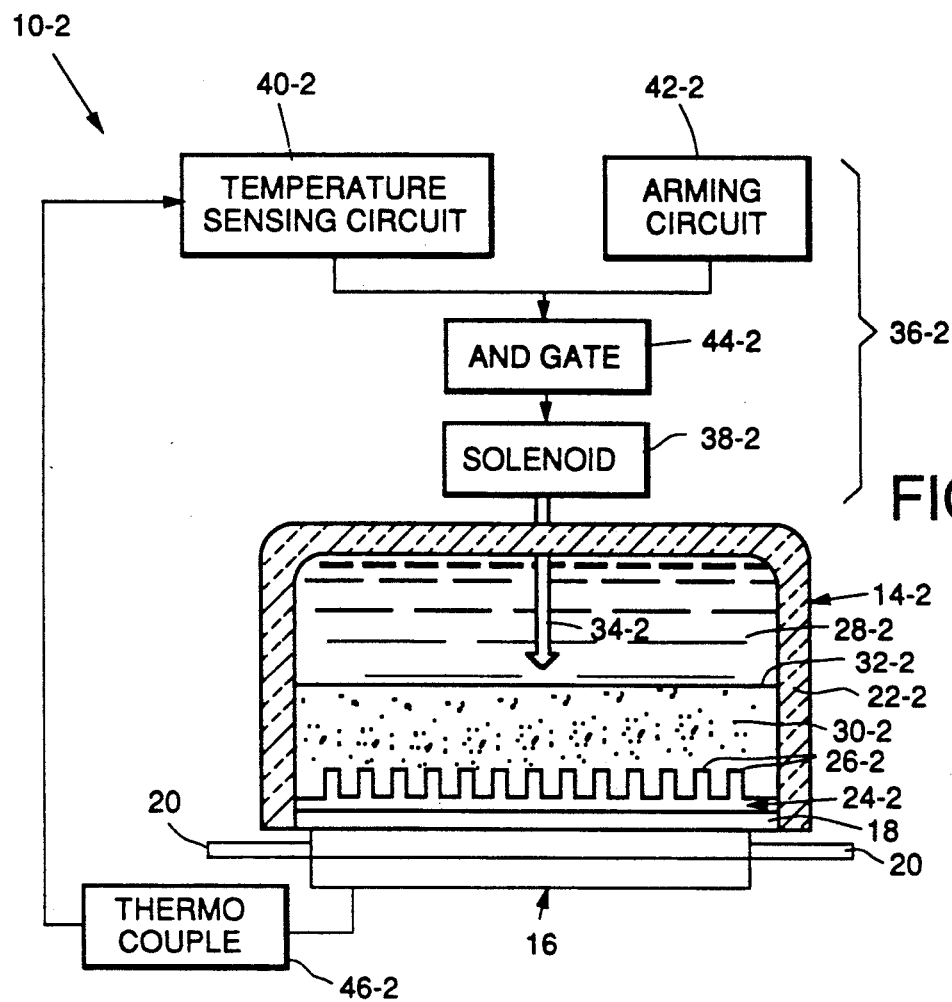
FIG. 2 is a view of a first embodiment of the present invention.

As shown in FIG. 2, endothermic cooler 10-2 comprises an enclosure 14-2 for an electronic circuit package or detector package assembly or similar component 16, which includes a lid 18 and other enclosing materials from which conductive wire leads 20 extend.

Enclosure 14-2 includes a cover portion 22-2 and a closure plate 24-2. Cover 22-2 is formed of any thermally and, preferably, electrically insulative material, e.g., of ceramic or plastic. Plate 24-2 comprises a thermally conductive material and may be provided with fins 26-2 to increase its thermally conductive area. Plate 24-2 is in good thermal contact with lid 18 of electronic component 16, to ensure that good heat movement will pass between the two.

Enclosure 14-2 is segregated into a pair of compartments 28-2 and 30-2 by a water impervious membrane 32-2. The membrane is formed from a suitable water or other solvent impermeable material, such as a polymer or metal foil, for example, of aluminum or tin. Water is the preferred solvent, although other solvents, such as acetone, may be employed. Water, preferably deionized water to preclude any degradation of the system, is disposed within compartment 28-2.

A composition of matter or solute, having the characteristic of providing an endothermic reaction when placed in solution with a suitable solvent, such as water, is placed within compartment 30-2, and kept dry by membrane 32-2 until ready for use as a cooling agent. Such a composition of matter, which comprises one or more of a selected group of salts, produces relatively cold solutions. Salts capable of producing the desired endothermic cooling may be selected from those listed in the table printed on Page D-102 of the CRC Handbook of Chemistry and Physics, 57th edition. Based upon experimental testing, the following salts have been found suitable for use in the present invention to provide a design based upon a 1.5 watt capacity over 20 minutes (1800 Joules). The amounts of salt and water required to meet the desired cooling requirement, as listed in the below table, have been calculated, assuming a solution heat capacity of approximately 1 cal/gram ° C. The final solution temperature, also indicated in this table, assumes a starting temperature of 22° C.

| SUBSTANCE | Final Solution Temperature (°C.) | Amount of Water (grams) | Amount of Salt (grams) | Total Weight (grams) |
| --- | --- | --- | --- | --- |
| Potassium Thiocyanate | −11 | 4.7 | 8.3 | 13.0 |
| Ammonium Thiocyanate | −10 | 5.9 | 7.5 | 13.4 |
| Ammonium Nitrite | −1 | 8.4 | 10.2 | 18.6 |
| Potassium Iodide | 0 | 8.2 | 11.3 | 19.5 |
| Ammonium Chloride | 4 | 18.4 | 5.5 | 23.9 |
| Ammonium Nitrite | 5 | 13.7 | 11.6 | 25.3 |
| Ammonium Acetate | 11 | 17.8 | 21.3 | 39.1 |
| Sodium Nitrite | 13 | 26.0 | 21.8 | 47.8 |
| Sodium Nitrate | 14 | 28.0 | 25.8 | 53.8 |

The selection of these salts was based upon the desire to utilize the least amount of salt with a maximum cooling. It is to be understood that salts other than those listed above may be utilized in order to tailor the endothermic solution to the specific need required.

In order to form a solution, membrane 32-2 must be pierced or otherwise rendered ineffective from its function of segregating the two compartments. A preferred system comprises the use of a piercing spike 34-2, which is actuated by a mechanism 36-2.

Actuating mechanism 36-2 includes a solenoid 38-2, which is energized by both a temperature sensing circuit 40-2 and an arming circuit 42-2 operating through an AND gate 44-2. A thermocouple 46-2, which is placed in thermal contact with electronic component 16, is coupled to temperature sensing circuit 40-2 and senses the temperature of the electronic component. All these devices are of conventional construction.

Therefore, in the preferred embodiment of the present invention, it is desired that spike 34-2 is operative to pierce membrane 32-2 only when temperature circuit 40-2 and arming circuit 42-2 are both actuated. Their signals, therefore, must both be sensed by AND gate 44-2 in order that solenoid 38-2 be energized. This dual input ensures that cooler 10-2 will not prematurely operate, that is, to mix the water and the salts into a solution, such as when a missile is still being carried by an aircraft or other transport vehicle. At the time of the launch of the missile from the aircraft, arming circuit 42-2 is activated so that only a temperature signal conducted from thermocouple 46-2 to temperature sensing circuit 40-2 will permit AND gate 44-2 to provide the actuating signal to solenoid 38-2 and thereby cause spike 34-2 to rupture membrane 32-2.

Figure 3:
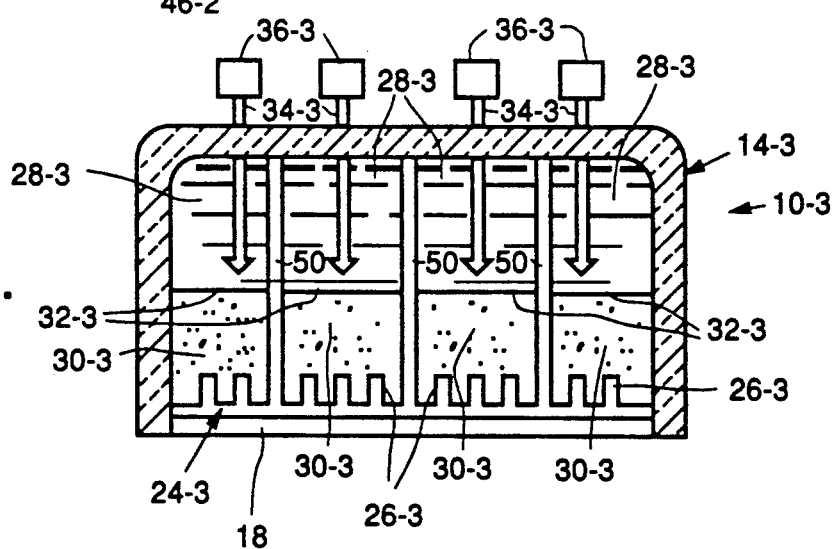
FIG. 3 illustrates a second embodiment of the present invention.

FIG. 3 depicts multiple use of an endothermic cooler 10-3 which comprises a battery of compartments 28-3 and 30-3 separated by their membranes 32-3. Each of these compartments and membranes are formed within an enclosure 14-3, which is segregated by walls 50 into four pairs of solute-solvent compartments. In other respects, cooler 10-3 is exactly like cooler 10-2 described with respect with the embodiment disclosed in FIG. 2. In FIG. 3, individual piercing spikes 34-3 for each of the membranes 32-3 are operated individually by their own actuating mechanisms 36-3, each being configured like mechanism 36-2 of FIG. 2. Therefore, it is possible to cool an electronic component several times over, simply by permitting a seriatim operation of the individual actuating mechanisms 36-3 to effect the seriatim rupture of their respective membranes 32-3.

Figure 4:
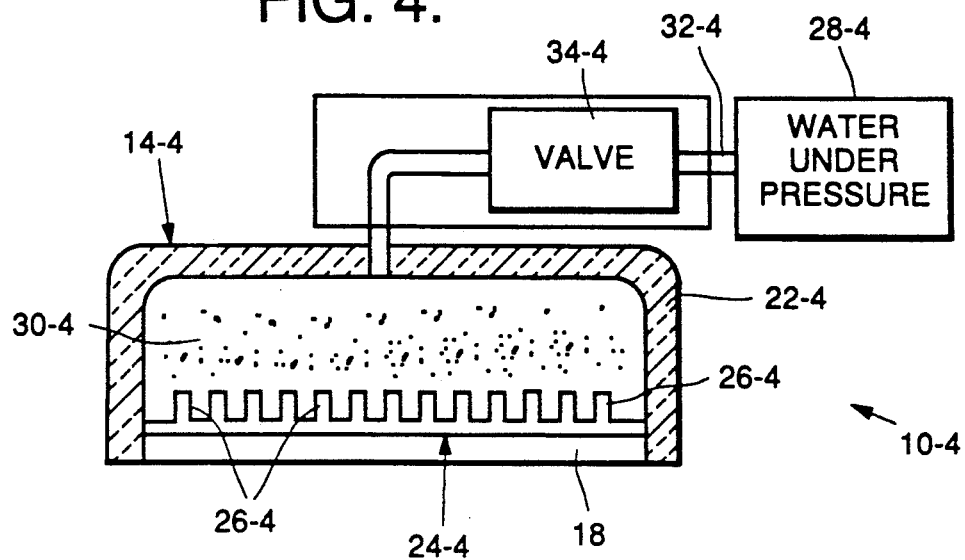
FIG. 4 depicts a third embodiment of the present invention.

Referring now to FIG. 4, an endothermic cooler 10-4 includes an enclosure 14-4 having a compartment 30-4 for containing the salts within a cover 22-4. In this embodiment, the water containing compartment, designated by indicium 28-4, is spaced from enclosure 14-4 but connected thereto by the equivalent of piercing spikes 34-2 and 34-3 of the prior embodiments. In both cases, a valve 34-4 and piercing spikes 34-2 and 34-3 both operate as means to effect a mixing of the water and the salts. An actuating mechanism 36-4 operates in a manner similar to that of actuating mechanisms 36-2 and 36-3 of the prior embodiments. Valve 34-4 permits mixing of the solvent and the solute, through actuation by a similar arrangement of a temperature sensing circuit, an arming circuit, an AND gate, a solenoid and a thermocouple, such as is illustrated in FIG. 2.

Equally operable, instead of the specific use of a conduit, or in addition thereto, is the employ of a spray head for spraying the solvent over the solute. In operation, the endothermic heat of mixing, which is experienced when selected salts are dissolved in water, forms the basis for the present invention. Because the best endothermic solution preferably comprises a very soluble salt with a large endothermic heat of mixing, a cooling factor (CF) was calculated to serve as a guide for selecting the optimum salt-water system, that is, the system having the least weight for a given cooling requirement. The cooling factor was defined as a product of the heat of solution at infinite dilution and the solubility of the salt in 100 grams of water, according to the following equation:

$$CF = (\text{Heat of Solution}) \times (\text{Solubility})$$

Utilizing the table of salts listed on Page D-102 of the CRC Handbook of Chemistry and Physics, 57th Edition, a group of candidate salts as listed in the above table were selected for experimental purposes. Based upon a series of simple calorimetry experiments, the cold solution temperature under saturated conditions was measured. The results of this study, given in the above table, shows that the solution of potassium thiocyanate and water provided the lowest temperature at $-11°$ C.

Although the invention has been described with respect to particular embodiments thereof, it should be realized that various changes and modifications may be made therein without departing from the spirit and scope of the invention.

What is claimed is:

1. An endothermic cooler for electronic components comprising:
    an enclosure having a thermally conductive coupling to an electronic component;
    a source of water;
    a composition of matter disposed in said enclosure and capable of providing an endothermic reaction when mixed in solution with the water;
    means for effecting the solution comprising:
    a) a compartment containing said composition of matter within said enclosure;
    b) means for segregating the water from said composition of matter; and
    c) means for rendering said segregating means ineffective comprising: a solenoid, an AND gate coupled to said solenoid, a thermocouple thermally coupled to said electronic component, an arming circuit, and a temperature sensing circuit coupled to said thermocouple, said temperature sensing circuit being coupled in parallel with said arming circuit to said AND gate, thereby to enable mixing of the water and the composition of matter.

2. An endothermic cooler according to claim 1 in which said segregating means comprises a water impervious membrane, and said means for rendering said segregating means ineffective comprises a membrane piercing means coupled to said solenoid.

3. An endothermic cooler according to claim 1 in which said segregating means comprises a conduit coupling said source of water to said enclosure, and said means for rendering said segregating means ineffective comprises a valve in said conduit.

* * * * *